United States Patent [19]

Kozai et al.

[11] Patent Number: 4,632,478

[45] Date of Patent: Dec. 30, 1986

[54] CONTACT OF CONNECTOR

[75] Inventors: Hiroshi Kozai; Morio Suzuki, both of Hadano; Matsuo Katoh, Utsunomiya; Toshiaki Suzuki, Mooka, all of Japan

[73] Assignees: Hitachi, Ltd.; Daiichi Denshi Kogyo Kabushiki Kaisha, both of Japan

[21] Appl. No.: 705,541

[22] Filed: Feb. 26, 1985

[30] Foreign Application Priority Data

Mar. 2, 1984 [JP] Japan .................................. 59-29224

[51] Int. Cl.[4] .............................................. H05K 1/00

[52] U.S. Cl. .......................... 339/17 LC; 339/176 M; 339/256 R

[58] Field of Search ................ 339/176 MP, 177 MF, 339/17 C, 17 LC, 258 R, 256 R

[56] References Cited

U.S. PATENT DOCUMENTS

| | | | |
|---|---|---|---|
| 3,360,767 | 12/1967 | Brown et al. | 339/176 MP |
| 3,422,394 | 1/1969 | Antes | 339/176 MP |
| 3,479,637 | 11/1969 | Glissen | 339/176 MP |
| 3,829,817 | 8/1974 | Beavitt | 339/176 MF |
| 4,062,610 | 12/1977 | Doty et al. | 339/176 MP |
| 4,077,694 | 3/1978 | Cobaugh et al. | 339/176 MP |
| 4,286,837 | 9/1981 | Yasutake et al. | 339/176 MP |

FOREIGN PATENT DOCUMENTS

| | | | |
|---|---|---|---|
| 2802800 | 7/1978 | Fed. Rep. of Germany | 339/176 MP |
| 561311 | 12/1977 | U.S.S.R. | 339/176 MP |

*Primary Examiner*—Gil Weidenfeld
*Assistant Examiner*—David L. Pirlot
*Attorney, Agent, or Firm*—Silverman, Cass, Singer & Winburn, Ltd.

[57] ABSTRACT

A contact of a connector made of an elongated resilient material and having an inner end fixed to a connector housing and a midway to be in contact with a mating contact of another connector. According to the invention, the contact comprises a substantially straight portion extending from a contacting portion of the midway with the mating contact to the fixed inner end, and an outer portion being bent in zigzag extending from the contacting portion to the distal end abutting against a surface of the connector housing, thereby obtaining a sufficient contacting resilient pressure to realize stable and reliable connecting condition with the mating contact and simultaneously achieving small-sized connectors and high speed signal transmission.

7 Claims, 10 Drawing Figures

CONTACT OF CONNECTOR

BACKGROUND OF THE INVENTION

1. Field of the Invention

This invention relates to a contact of a connector, and more particularly to a contact suitable for use in small-sized connectors for information transmission appliances.

2. Description of the Prior Art

With requirement of signal transmission at higher speed in information transmission line, it has been required to shorten lengths of conductive portions of contacts in connectors incorporated in information transmission lines. On the other hand, the connectors to be used in information transmission appliances have been intensively required to be small-sized, inasumuch as these appliances have been required to be small-sized. In this case, an indispensable condition to fulfill the requirement of the small-sized connectors is to achieve small-sized contacts.

Under the circumstances, however, such small-sized contacts should still realize reliable and stable contacting conditions with contacts of mating connectors inserted and connected or contacts of printed circuit boards in order to perform their inherent function. On the contrary, if the contacts are small-sized to shorten the signal transmission line, contacting resilient pressure of the contacts usually becomes insufficient to adversely affect the contacting conditions. Accordingly, the small-sizing of the contacts would encounter an unavoidable limitation.

Various attempts have therefore been effected in order to obtain sufficient contacting resilient pressures in sufficiently small-sized contacts. As shown in FIG. 1, for example, a contact 1 is bent at its mid portion or midway 1*a* into a wide S-shape, and its distal end 1*b* is then folded back to its holded portion 1*c* so as to abut against a surface of a connector housing 2. In this manner, the S-shaped midway 1*a* and the distal end 1*b* provide a contacting resilient pressure required when a contact 3 of a mating connector is inserted into this connector to be into contact with the contact 1. With this arrangement, however, a signal flowing into the contact 1 at its contacting point 1*d* passes through the S-shaped bent portion 1*a* to a connneting portion 1*e* as shown by arrows in the drawing, so that the signal transmission passage is much longer than that in a conventional contact 1, for example, as shown in FIG. 2.

In an alternative example as shown in FIG. 3, a contact 1 is bent so as to form a loop to bring its distal end 1*b* into the proximity of a holded portion. In order to obtain a resilient pressure with this arrangement substantially equivalent to the pressure of the contact shown in FIG. 1, however, the bent portion 1*f* of the loop should be fairly large, so that an overall length of the contact becomes much longer. As the result, the contact does not fulfill the requirement of the small-size and fails to shorten the signal transmission passage because a signal flowing at a contacting portion 1*d* into the contact passes through the loop 1*f* into a connecting portion 1*e* as shown by arrows in the drawing.

In a further alternative example, as shown in FIG. 4, a contact 1 comprises an upper portion 1*g* extending much longer than that of the contact shown in FIG. 2 and abutting with its distal end 1*b* against a surface of a housing 2 in order to obtain a predetermined resilient pressure. With this arrangement, a signal flowing at a contacting portion 1*d* passes straight into the contact as shown by an arrow in the drawing, so that the length of the signal transmission passage is sufficiently shortened in comparison with those in FIGS. 1 and 3. On the other hand, however, the upper portion 1*g* should be considerably elongated in order to obtain a resilient pressure substantially equivalent to that of the contact shown in FIG. 1, so that such an elongated contact does not fulfill the requirement of the small-sized contact. In addition, a distance from an entrance of this connector for a mating connector to the contacting portion 1*d* becomes considerably long, so that a contact of the mating connector is also unavoidably long so as to elongate the signal transmission passage of the mating connector to give rise to reduction in signal transmission speed.

SUMMARY OF THE INVENTION

It is a principal object of the invention to provide a contact capable not only of shortening a signal transmission passage but also ensuring a predetermined contacting resilient pressure to meet the high speed signal transmission and small-sized connector.

In order to achieve this object, the contact of a connector made of an elongated resilient material and having an inner end fixed to a connector housing and a midway to be in contact with a mating contact of another connector to be connected to the first mentioned connector, according to the invention comprises a substantially straight portion extending from a contacting portion of the midway with the mating contact to the fixed inner end and an outer portion extending from the contacting portion to its distal end, the outer portion being bent in zigzag and the distal end abutting against a surface of the connector housing.

The outer portion is preferably bent in S-shape.

The distal end of the contact abuts against the surface of the connector housing with a free edge or a flat surface of the distal end.

The distal end of the contact is preferably beveled or rounded at its edge to prevent the surface of the connector housing from being scraped by the edge.

In order that the invention may be more clearly understood, preferred embodiments will be described, by way of example, with reference to the accompanying drawings.

DETAILED DESCRIPTION OF THE PREFERRED EMBODIMENT

Figure 5:
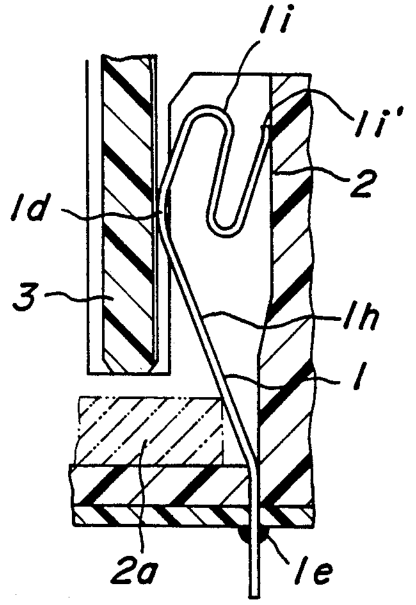
FIG. 5 is a fragmentary sectional view of a connector including a contact of a preferred embodiment of the invention.

Referring to FIG. 5 illustrating one embodiment of the invention, a contact 1 comprises a straight portion 1*h* extending from its connecting portion 1*e* fixed to a connector housing 2 to a contacting portion 1*d* in contact with a mating connector, and an outer portion 1*i* extending outwardly from the contacting portion 1*d* and bent in zigzag or S-shape whose free edge 1*i'* or flat free end surface abuts against the connector housing 2 to obtain a predetermined resilient pressure or force.

Figure 1:
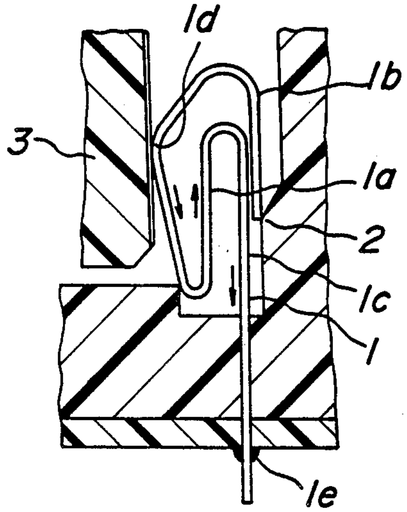
FIG 1 PRIOR ART
FIG. 1 is a fragmentary sectional view of a connector having a contact of the prior art.
Figure 2:
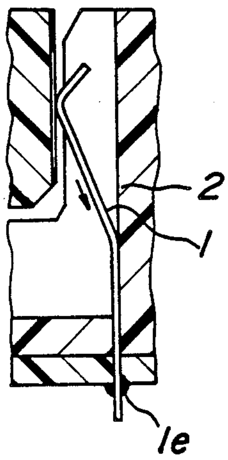
FIG 2 PRIOR ART
FIG. 2 is a fragmentary sectional view of a connector having another contact of the prior art.
Figure 3:
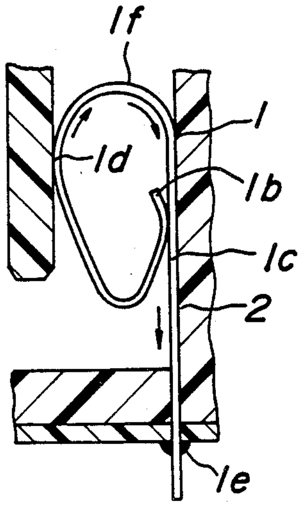
FIG 3 PRIOR ART
FIG. 3 is a fragmentary sectional view of a connector having a further contact of the prior art.
Figure 4:
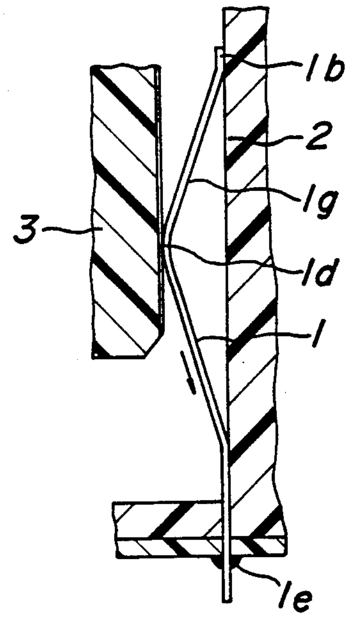
FIG 4 PRIOR ART
FIG. 4 is a fragmentary sectional view of a connector having a different contact of the prior art.

With this arrangement, a distance or signal transmission passage for a signal flowing from the contacting portion 1*d* to the connecting portion 1*e* is the shortest, because the passage consisting of the straight portion 1*h* in the similar manner as in FIG. 4. According to the invention, moreover, the zigzag bent portion 1*i* is formed instead of the straight extending portion 11 for obtaining the required contacting resilient pressure in FIG. 4, so that notwithstanding the short overall length of the contact, a predetermined contacting resilient pressure can be obtained without elongating a signal transmission passage of a mating connector. Therefore, the contact according to the invention can achieve the stable and reliable connecting condition, and simultaneously serves to realize a small-sized connector and high speed signal transmission.

According to the invention, the contacting resilient pressure is derived not only from the zigzag bent portion 1*i* but also the straight portion 1*h*. In this case, the housing 2 may be formed with a projection 2*a* whose edge abuts against the midway of the straight portion 1*h* as shown in broken lines in FIG. 5, thereby preloading the straight portion. When the contact 3 of a mating connector is inserted into the connector, the zigzag bent portion 1*i* is compressed to move the free edge 1*i'* on the surface of the connector housing 2 in a direction opposite to the insertion of the mating connector so as to cause a risk of the surface being cut or scraped. In order to avoid this, the free edge 1*i'* may be beveled at 1*j* as shown in FIG. *6a* or rounded at 1*k* as shown in FIG. *6b*. FIGS. *6c* and *6d* illustrate contacts of particular embodiments according to the invention, which have contacting portions 1*d* adapted to be in point-contact with mating contacts. The above beveled or rounded edge 1*j* or 1*k* can be applied to these contacts of the point-contact type.

Figure 7:
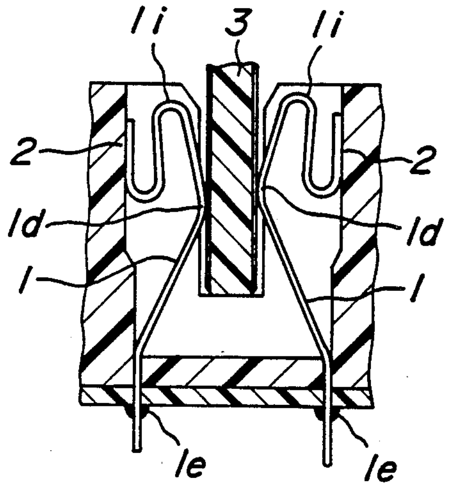
FIG. 7 is a fragmentary sectional view of a connector including two contacts according to the invention.
Figure 6A:
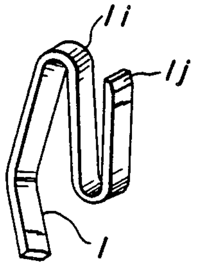
FIG. 6*a* is a partial perspective view illustrating a contact of another embodiment of the invention.
Figure 6B:
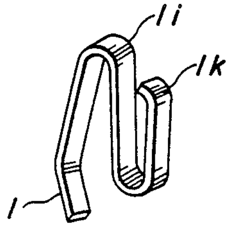
FIG. 6*b* is a partial perspective view illustrating a contact of a further embodiment of the invention.
Figure 6C:
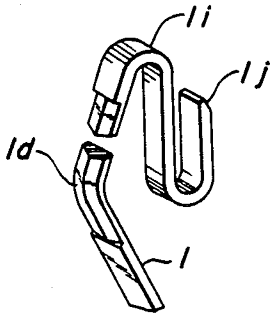
FIG. 6*c* is a perspective view of a contact of point-contact type according to the invention.
Figure 6D:
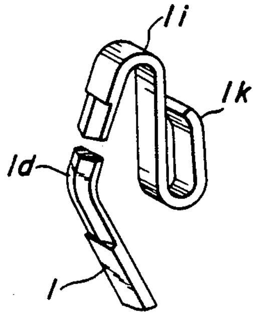
FIG. 6*d* is a perspective view of another contact of point-contact type according to the invention.

Although the above embodiments have been explained to arrange the contact on one side of the contact 3 of the mating connector, contacts according to the invention can of course be arranged on both sides of the contact 3 so as to be in contact therewith as shown in FIG. 7.

As can be seen from the above description, the invention can provide the contact of a connector, having a sufficient contacting resilient pressure to realize stable and reliable connecting condition with a mating contact and simultaneously capable of achieving small-sized connectors and high speed signal transmission, thereby greatly contributing the improvement in performance of connectors for use in information transmission circuits.

It is further understood by those skilled in the art that the foregoing description is that of preferred embodiments of the disclosed contacts and that various changes and modifications may be made in the invention without departing from the spirit and scope thereof.

What is claimed is:

1. A contact of a connector formed of an enlongated resilient material comprising, an inner end fixed to a connector housing and a midway to be in contact with a mating contact of another connector to be connected to the first mentioned connector, said contact including a substantially straight portion extending from a contacting portion of said midway to said fixed inner end and an outer portion extending from said contacting portion to a distal end of said contact, said outer portion being bent in generally s-shaped configuration and said distal end abutting against a surface of said connector housing said abutting distal end being movable along said connector housing in a direction opposite to the direction of insertion of said mating contact.

2. A contact as claimed in claim 1 in which said distal end of the contact has a flat edge which abuts against the surface of the connector housing.

3. A contact as claimed in claim 1 in which said distal end of the contact has a flat surface which abuts against the surface of the connector housing.

4. A contact as claimed in claim 1 in which said distal end of the contact is beveled at its edge to prevent the surface of the connector housing from being scraped by the edge.

5. A contact as claimed in claim 1 in which said distal end of the contact is rounded at its edge to prevent the surface of the connector housing from being scraped by the edge.

6. A contact as claimed in claim 1 in which said midway of the contact has a cross-sectional configuration in point-contact with a surface of said mating contact.

7. A contact as claimed in claim 1 in which said connector housing includes a projection abutting against said straight portion of the contact so that it is subjected to a preload.

* * * * *